US012317674B2

(12) United States Patent
Kim et al.

(10) Patent No.: US 12,317,674 B2
(45) Date of Patent: May 27, 2025

(54) DISPLAY DEVICE COMPRISING OPTICAL COMPENSATION LAYER AT LIGHT-EMITTING UNIT AND TRANSMISSIVE UNIT

(71) Applicant: LG Display Co., Ltd., Seoul (KR)

(72) Inventors: Jae Hyeon Kim, Paju-si (KR); Kwan Soo Kim, Seoul (KR); Young Nam Lim, Seoul (KR); Min Jee Kim, Seoul (KR); Seok Hyun Kim, Seoul (KR); Min Geun Song, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/427,367

(22) Filed: Jan. 30, 2024

(65) Prior Publication Data
US 2024/0172474 A1  May 23, 2024

Related U.S. Application Data

(63) Continuation of application No. 17/554,990, filed on Dec. 17, 2021, now Pat. No. 11,925,057.

(30) Foreign Application Priority Data

Dec. 31, 2020 (KR) .................. 10-2020-0190036

(51) Int. Cl.
*H10K 50/852* (2023.01)
*H10K 102/00* (2023.01)

(52) U.S. Cl.
CPC ..... *H10K 50/852* (2023.02); *H10K 2102/351* (2023.02)

(58) Field of Classification Search
None
See application file for complete search history.

(56) References Cited

U.S. PATENT DOCUMENTS

| 11,925,057 | B2 * | 3/2024 | Kim | H10K 59/876 |
| 2016/0099438 | A1 * | 4/2016 | Cho | H10K 59/80518 |
| | | | | 257/40 |
| 2017/0125744 | A1 * | 5/2017 | Kim | H10K 59/875 |
| 2018/0005574 | A1 * | 1/2018 | Kim | H10K 50/818 |
| 2020/0212130 | A1 * | 7/2020 | Kim | H10K 59/87 |
| 2022/0123061 | A1 | 4/2022 | Lee et al. | |
| 2022/0165983 | A1 * | 5/2022 | Ha | H10K 50/844 |

FOREIGN PATENT DOCUMENTS

| KR | 10-1275810 B1 | 6/2013 |
| KR | 10-2015-0096021 A | 8/2015 |
| KR | 10-1829890 B1 | 2/2018 |
| KR | 10-2020-0082763 A | 7/2020 |

* cited by examiner

*Primary Examiner* — Daniel Whalen
(74) *Attorney, Agent, or Firm* — Birch, Stewart, Kolasch & Birch, LLP

(57) ABSTRACT

Discussed is a display device including a substrate having a first region and a second region, an anode at the first region, an organic layer at the second region and at the first region, a cathode on the organic layer of the first region, a bank between the first region and the second region, an optical compensation layer on the cathode of the first region and the organic layer of the second region, and an encapsulation layer on the optical compensation layer at the first region and the second region. The cathode is interposed between the optical compensation layer and the organic layer over the first region.

23 Claims, 8 Drawing Sheets

$n_1 < n_2$

DISPLAY DEVICE COMPRISING OPTICAL COMPENSATION LAYER AT LIGHT-EMITTING UNIT AND TRANSMISSIVE UNIT

CROSS-REFERENCE TO RELATED APPLICATIONS

This application is a Continuation Application of U.S. patent application Ser. No. 17/554,990, filed on Dec. 17, 2021, which claims priority to Korean Patent Application No. 10-2020-0190036, filed in the Republic of Korea on Dec. 31, 2020, the entire contents of all these applications being hereby expressly incorporated by reference into the present application.

BACKGROUND OF THE DISCLOSURE

Field

Embodiments of the present invention relate to a display device, and more particularly to a display device having high transparency and high efficiency characteristics in a structure to which electrode patterning is applied.

Discussion of the Related Art

Self-luminous display devices such as organic light-emitting displays or quantum dot light-emitting displays for compact and clear color display without a separate light source have been considered as a competitive option.

A self-luminous display device includes a plurality of pixels on a substrate, two electrodes facing each other in each pixel, and a light-emitting diode including a light-emitting layer therebetween.

Recently, various applications for a transparent display device capable of simultaneously emitting light by applying a self-luminous display operation have been considered.

SUMMARY OF THE INVENTION

In a device including both a light-emitting unit and a transmissive unit, the light-emitting unit and the transmissive unit can have different internal optical structures and can have a common capping layer, and thus it can be difficult to improve both transmittance and efficiency.

To address this and other limitations, according to embodiments of the present invention, an optical compensation layer can be disposed above the transmissive unit and the light-emitting unit, and thus it can be possible to improve both transmittance and efficiency.

In the display device according to embodiments of the present invention, both the transmittance and efficiency of light lastly transmitted through the light-emitting unit and the transmissive unit can be improved due to a phase difference π between an organic layer and an optical compensation layer.

In an aspect, an embodiment of the present invention provides a display device includes a substrate having a first region and a second region, an anode disposed at the first region, an organic layer disposed above the anode of the first region and the second region, a cathode disposed on the organic layer of the first region, an optical compensation layer disposed above the cathode of the first region and above the organic layer of the second region and in contact with a layer having a lower refractive index than a refractive index of the organic layer, and an encapsulation layer disposed on the optical compensation layer.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Figure 1:
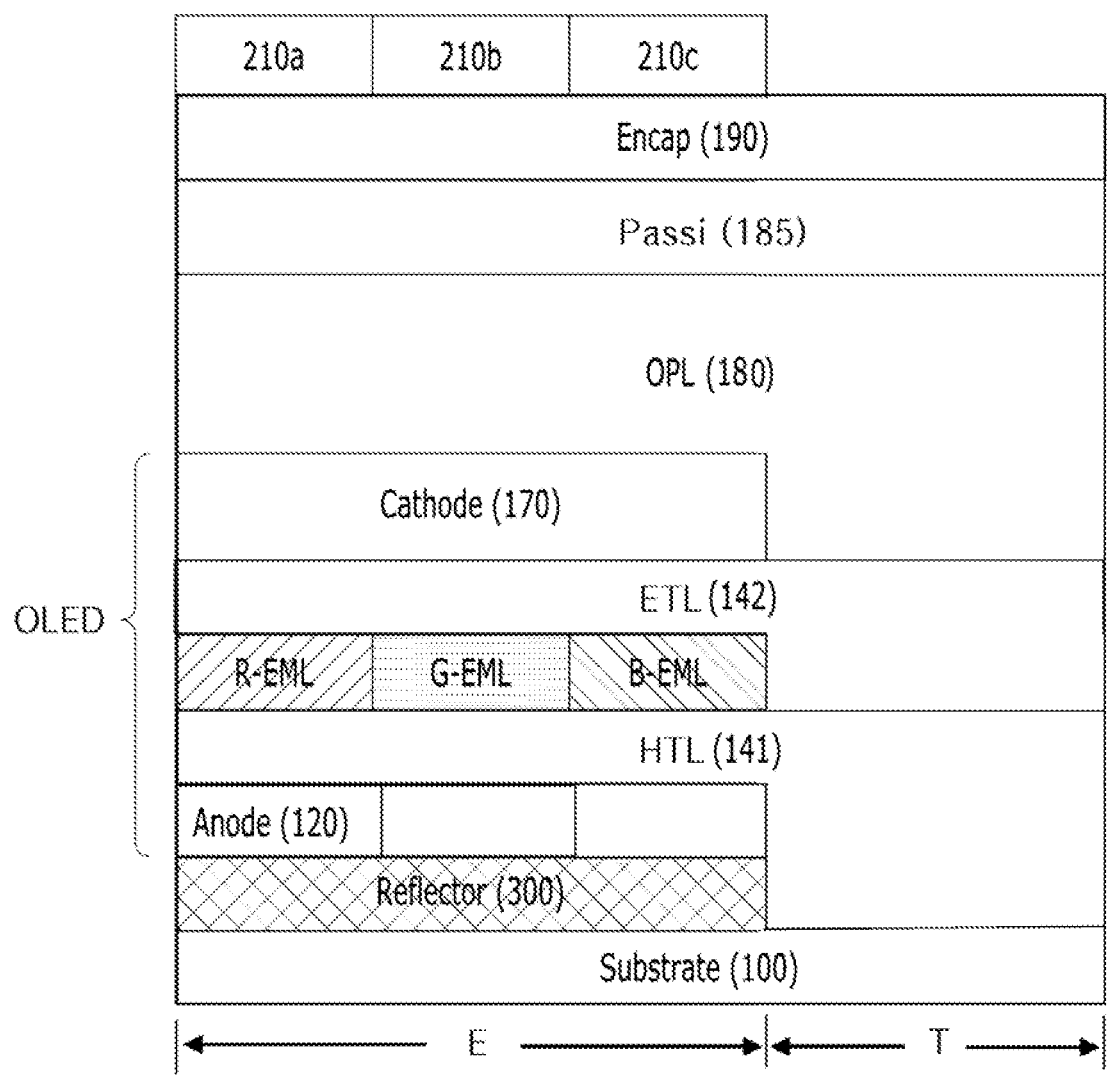
FIG. 1 is a cross-sectional view of a display device according to a first embodiment of the present invention.

Reference will now be made in detail to the example embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it can make the subject matter of the embodiments of the present invention rather unclear. Further, the names of elements used in the following description of the embodiments of the present invention are selected in consideration of ease of preparation of the specification, and can thus differ from the names of parts of an actual product.

The shapes, sizes, ratios, angles and numbers of elements given in the drawings to describe the embodiments of the present invention are merely by example, and thus, embodiments of the present invention are not limited to the illustrated details. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In the interpretation of elements included in the various embodiments of the present invention, it is to be interpreted that the elements include error ranges unless stated otherwise.

In the following description of the embodiments, it will be understood that, when positional relationships are expressed, for example, when an element is said to be "on", "above", "over", "below" "under" or "beside" another element, the two elements can directly contact each other, or one or more other elements can be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to distinguish the same or similar elements. Therefore, a first element described hereinafter could be termed a second element without departing from the technical scope of the invention.

Respective features of the various embodiments of the present invention can be partially or wholly coupled to or combined with each other and be interlocked or driven in various technical manners, and the respective embodiments can be implemented independently of each other or be implemented together through connection therebetween.

Hereinafter, embodiments of the present invention will be described more fully with reference to the accompanying drawings, in which example embodiments of the invention are shown.

FIG. 1 is a cross-sectional view of a display device according to a first embodiment of the present invention. All the components of each display device according to all embodiments of the present invention are operatively coupled and configured.

As shown in FIG. 1, the display device according to the embodiment of the present invention can include a substrate having a first region E and a second region T, an anode 120 disposed in the first region E, an organic layer ETL 142 disposed above the anode 120 of the first region E and in the second region T, a cathode 170 disposed on the organic layer ETL 142 of the first region E, an optical compensation layer (OPL) 180 disposed above the cathode 170 of the first region E and above the organic layer ETL 142 of the second region T and in contact with a layer having a lower refractive index than the organic layer, and an encapsulation layer 190 disposed above the optical compensation layer 180. At least one of the anode 120 and the cathode 170 need not be in the second region T.

The optical compensation layer (OPL) 180 can be referred to as a capping layer in one or more embodiments of the present invention. Also, the cathode 170 need not be formed on the organic layer ETL 142 of the second region T. Additionally, the optical compensation layer 180 can have different thicknesses over the first region E and the second region T. For example, a thickness of the optical compensation layer 180 over the second region T can be greater than a thickness of the optical compensation layer 180 over the first region E. The organic layer ETL 142 may be an electron transport layer.

For example, the first region E can be a light-emitting unit that emits light through light-emitting layers including a red EML (R-EML), a green EML (G-EML), and a blue EML (B-EML), the second region T can be a transmissive unit, and in the second region T, a metallic material such as a reflector 300, the anode 120, or the cathode 170 can be omitted in order to improve transmittance, and the light-emitting layers R-EML, G-EML, and B-EML can also be omitted. Accordingly, a layer structure in the first region E can be different from a layer structure in the second region T.

Depending on the instances, the second region T can be applied to a structure having a patterned electrode. For example, the second region T can be defined in a camera hole for positioning a camera therein.

The optical compensation layer 180 can be in contact with the cathode 170 in the first region E and can be in contact with the organic layer ETL 142 in the second region T.

According to embodiments of the present invention, the optical compensation layer 180 can invert a phase of resonance between the light-emitting unit and the transmissive unit in a structure having the patterned cathode. For example, a light-emitting unit (e.g., the first region) E can be configured to cause RGB constructive interference inside the light-emitting device OLED, and in a transmissive unit (e.g., the second region) T, a low refractive index is changed to a high refractive index in a direction in which light proceeds from an interface between the electron transport layer (ETL) 142 and the optical compensation layer 180, and thus the interface has an opposite phase to a lower surface of the cathode 170 at a side of the light-emitting device OLED. Due to such opposite phases, when light proceeds in the light-emitting unit E, the light can be emitted by causing interfacial reflection. In embodiments of the present invention, reference to light includes light in the visible range, but such is not required, and light outside of the visible range can be used.

Accordingly, an optical structure of the display device according to embodiments of the present invention can be designed to improve the maximum transmittance by improving both transmittance and efficiency based on a difference in the optical distance of light that is lastly emitted through the optical compensation layer via the transmissive unit and light that is emitted directly from the transmissive unit.

For an RGB cavity, when a light-emitting unit is applied to be optimized for constructive interference, it can be possible to optimize transmittance by satisfying destructive interference in the transmissive unit due to a phase difference π between a final organic layer and the optical compensation layer in a light-emitting device.

The organic layer ETL 142 that is in contact with the cathode 170 and the optical compensation layer 180 can be the electron transport layer (ETL) 142 like in the illustrated example.

Depending on the instances, the organic layer ETL 142 can be the uppermost component of the organic layer included in the light-emitting device OLED. For example, when an electron injection layer is formed as an organic layer, the optical compensation layer 180 can also be in contact with the electron injection layer.

When the electron injection layer is formed of an inorganic material, it can be possible to pattern the electron injection layer together when the cathode 170 is formed. In particular, when the electron injection layer includes metal among inorganic materials, the electron injection layer can also be considered as a component of the cathode 170.

In the display device according to embodiments of the present invention, the cathode 170 can be patterned to improve the transmittance of the transmissive unit T, and before the cathode 170 is formed on the ETL 142, an organic pattern can remain in a portion corresponding to the second region T and then the cathode 170 can be formed in a portion without the organic pattern via deposition.

The cathode 170 according to embodiments of the present invention can be formed of, for example, magnesium, silver, magnesium alloy, silver alloy, zinc, or the like, in the display device according to embodiments of the present invention, and the light-emitting unit E can emit light in a top emission manner. Although described as formed of metals or metal alloys, the cathode 170 can be a non-metallic material having conductivity.

Although FIG. 1 illustrates the configuration in which the reflector 300 is in contact with the anode 120, the anode 120 can also be formed as a reflective electrode.

As shown in FIG. 1, when the anode 120 is separately formed on the reflector 300, the anode 120 can be a transparent electrode, which can optionally be formed of indium tin oxide (ITO) or indium zinc oxide (IZO) for lowering an interfacial barrier with a hole transport layer 141.

The hole transport layer 141 can be formed below the light-emitting layers R-EML, G-EML, and B-EML, and the ETL 142 can be formed above the light-emitting layers R-EML, G-EML, and B-EML. The hole transport layer 141 and the ETL 142 can be commonly formed irrespective of the light-emitting unit E and the transmissive unit T, and the optical compensation layer 180 formed after the cathode 170 is patterned can be in contact with the ETL 142.

Because a high refractive index is changed to a low refractive index at an interface between the organic layer, in particular, the ETL 142 and the optical compensation layer 180, a phase of light can be changed by $\pi$.

In the first region E, the organic layer can include a hole transport layer (HTL) 141, a light-emitting layer R-EML/G-EML/B-EML, and the ETL 142, and the hole transport layer 141 and the ETL 142 can extend to the second region T.

Light emitted from the light-emitting layer E can undergo constructive interference between the anode 120 and the cathode 170, and light transmitted through the transmissive unit T can undergo destructive interference between the ETL 142 and the optical compensation layer 180.

An inorganic protective layer (or a passivation layer) 185 can be further disposed between the optical compensation layer 180 and the encapsulation layer 190, and the inorganic protective layer 185 can have a lower refractive index than the optical compensation layer 180.

A refractive index $n_{ETL}$ of the ETL 142 and a refractive index $n_{OCL}$ of the optical compensation layer 180 can satisfy $$\left(\frac{n_{ETL} - n_{OCL}}{n_{ETL} + n_{OCL}}\right)^2 > 1\%.$$

The optical compensation layer 180 can have a thickness equal to or greater than approximately 100 Å to equal to or less than approximately 2000 Å. In the display device according to embodiments of the present invention, due to different optical phases generated because the ETL 142 is in contact with different surfaces, light can be transmitted without light loss due to destructive interference in the transmissive unit, it can be possible to optimize transmittance, and accordingly, high color efficiency as well as high transmittance can also be achieved by the optical compensation layer 180 having a small thickness. A detailed effect will be described below in relation to an experiment.

Figure 3A:
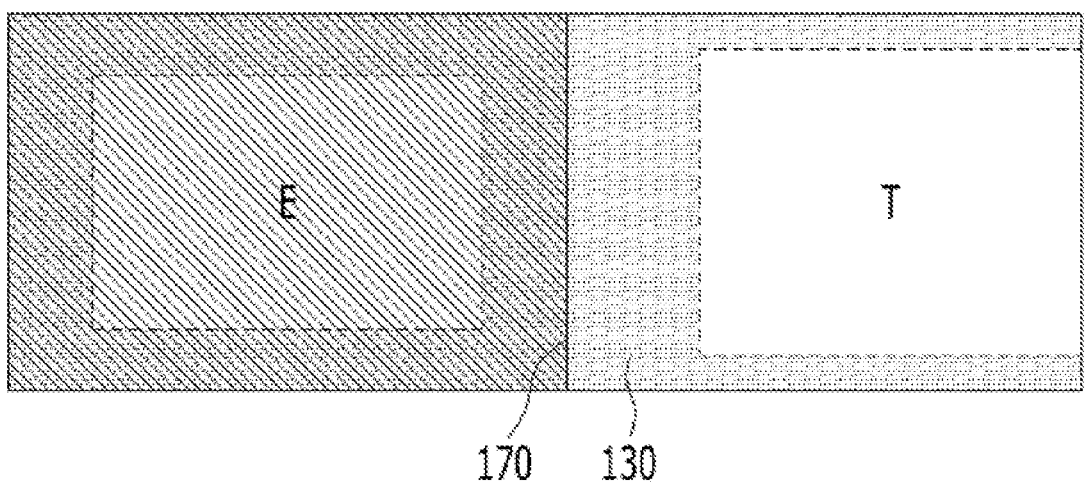
FIGS. 3A and 3B are plan views of a display device according to third and fourth embodiments of the present invention.

The substrate 100 can be divided into an active region (inside a dotted region) including a plurality of subpixels and a non-active region NA outside the active region (e.g., see FIG. 3A). Each sub-pixel can include the light-emitting unit E and the transmissive unit T, and the light-emitting unit can be defined as an open region of a bank 130 (e.g., see FIG. 3B). In order to express various colors, the light-emitting units E that emit light with different colors can be arranged adjacent to each other.

The light-emitting layers R-EML, G-EML, and B-EML can be organic light-emitting layers or quantum light-emitting layers. Other modes of self-emitting structure, such as micro-LED elements can be used in embodiments of the present invention.

The substrate 100 can be transparent like a glass or a transparent plastic film, or need not be transparent like a metal substrate. When the substrate 100 includes a transmissive unit, the substrate 100 can be formed of a transparent material to enable bottom emission, and for example, can be formed as a glass substrate or a transparent plastic film. When the device requires permanency or flexibility in use, the substrate 100 can be formed as a transparent plastic film in numerous instances, but when a glass substrate is applied, it can be possible to apply the glass substrate when the thickness of the glass substrate is small. Other transparent materials can be used for the substrate 100.

Figure 2:
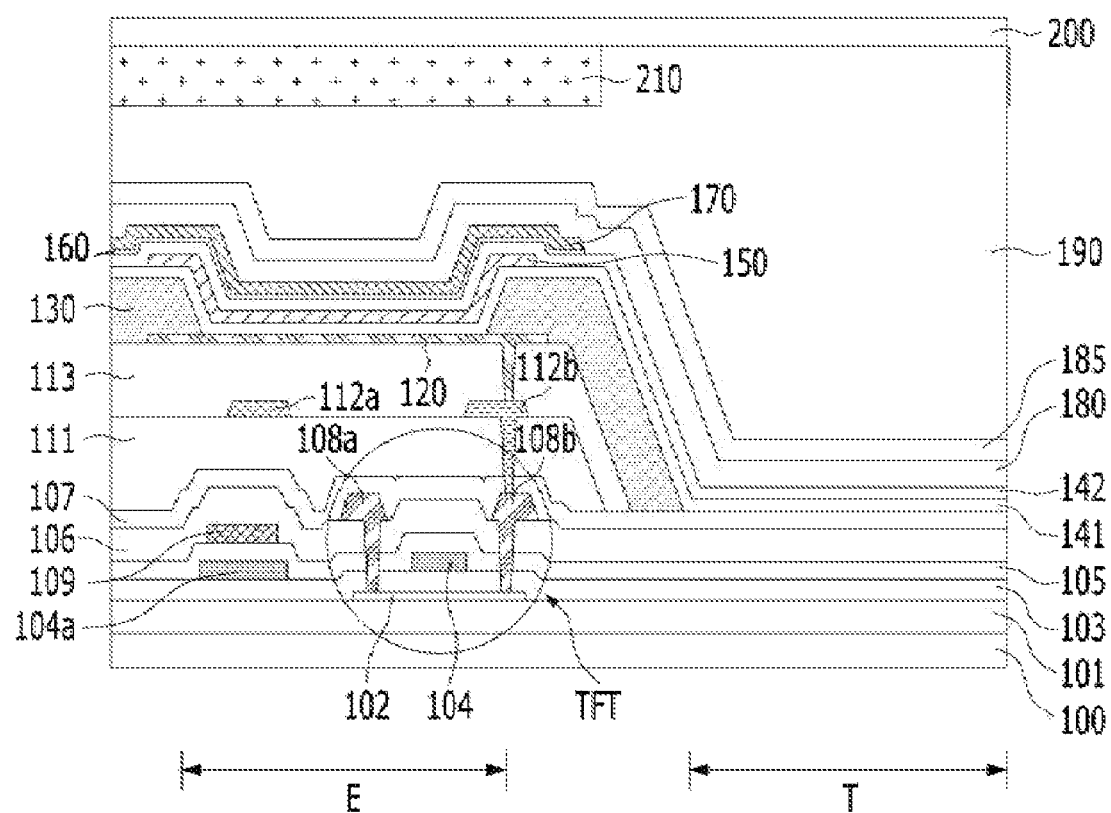
FIG. 2 is a cross-sectional view of a display device according to a second embodiment of the present invention.

A display device according to a second embodiment of the present invention shown in FIG. 2 is illustrated together with a driving thin film transistor (TFT) connected to the light-emitting device OLED.

For example, the display device according to the second embodiment of the present invention can include the substrate 100 having the first region E and the second region T, the anode 120 disposed in the first region, at least one organic layer (HTL and ETL) 141 and 142 disposed above the anode 120 in the first region E and in the second region T, an electron injection layer 160 disposed above the ETL 142 in the first region E and the second region T, and the cathode 170 disposed above the electron injection layer 160 in the first region E. For example, the electron injection layer 160 can be patterned together with the cathode 170.

In the display device according to the second embodiment of the present invention, the first region E can be a light-emitting unit, and the second region T can be a transmissive unit.

The first region E can be included in a light-emitting layer 150 between the anode 120 and the cathode 170, and when a differential voltage is applied between the anode 120 and the cathode 170, current can flow between the anode 120 and the cathode 170, and accordingly, the light-emitting layer 150 can emit light and can operate.

The second region T need not have the anode 120, the light-emitting layer 150, and the cathode 170 compared with the first region E, and accordingly, an image below the substrate 100 can be emitted upwards without change irrespective of a light-emitting operation of the light-emitting unit E.

A vertical structure including the anode 120, the cathode 170, the light-emitting layer 150 therebetween, the hole transport layer HTL 141, and the electron transport layer ETL 142 will be referred to as the light-emitting device OLED. A portion of the HTL 141, positioned below the light-emitting layer 150, among the HTL 141 and the ETL 142 of the light-emitting device can be configured by stacking a plurality of layers related to hole injection and hole transport. The ETL 142 above the light-emitting layer 150 can include a plurality of layers including both a hole block layer for blocking a hole from being emitted from the light-emitting layer or an electron transport layer related to electron transport.

The substrate 100 can include the plurality of light-emitting units E and the plurality of transmissive units T, and the anode 120 can be selectively included in the light-emitting unit E. The light-emitting units E can be divided by the bank 130 of FIG. 2. The light-emitting unit E can have light-emitting units that emit light with different colors, for example, red, green, and blue light-emitting units. However, the color of a light-emitting unit can be substituted with a combination of magenta, cyan, and yellow, and is not limited to red, green, and blue.

The hole transport layer 141 and the electron transport layer ETL 142 can be commonly formed in the light-emitting unit E and the transmissive unit T. This is because the hole transport layer 141 and the electron transport layer ETL 142 are integrally formed in an active region of the substrate without a fine metal mask when the first and second common layers 141 and 142 are formed. The first and second common layers 141 and 142 can be very thin and can be optically transparent, and affect light transmission only slightly.

The anode 120 can be configured by stacking a reflective metal and one or more transparent metals.

In the light-emitting device disposed in the light-emitting unit E, light generated by the light-emitting layer 150 can be lastly transmitted through the cathode 170 while repeatedly resonating between the anode 120 and the cathode 170, and thus, the cathode 170 needs to have reflectivity whereby light is repeatedly reflected again on an internal surface of the cathode 170, opposing the anode 120, and needs to have transmittance because light needs to be lastly transmitted through the cathode 170.

Although the illustrated light-emitting device has a single light-emitting layer, embodiments of the present invention are not limited thereto, and the light-emitting device can include a plurality of light-emitting layers. Depending on the instances, the light-emitting device can include a plurality of stacked layers that are separated from each other by a charge generation layer and can also be applied to a structure including at least one light-emitting layer in each stack.

In the specification, the anode 120 can include a reflective electrode, the cathode 170 can be transflective, and the anode 120 and the cathode 170 can function as an anode and a cathode of the light-emitting device, respectively. A transparent electrode can be further disposed on an upper surface and/or a lower surface of the reflective electrode of the anode 120.

The cathode 170 according to embodiments of the present invention can be integrally formed into a plurality of light-emitting units E included in the substrate 100 and thus can be referred to as a common electrode. Depending on the instances, the anode 120 can be referred to as a first electrode of the light-emitting device and the cathode 170 can be referred to as a second electrode.

The cathode 170 according to embodiments of the present invention can be transflective in order to function as a cathode of the light-emitting device.

In the cathode 170 according to embodiments the present invention, a predetermined potential needs to be maintained over the light-emitting units E of the substrate 100 in the state in which the cathode 170 is removed from the transmissive unit T, and thus the cathode 170 can be formed of metal having a low sheet resistance and a low work function equal to or less than 4 eV.

Hereinafter, components that have not yet been described with reference to FIG. 2 will be described.

A buffer layer 101 can be disposed on the substrate 100 to prevent influence of impurities in the substrate 100. The display device can further include a thin film transistor TFT including an active layer 102 disposed on a predetermined portion of the buffer layer 101, a gate electrode 104 that overlaps a portion of the active layer 102 above the active layer 102 by interposing a gate insulating layer 103 between the active layer 102 and the gate electrode 104, and a source electrode 108a and a drain electrode 108b that are in contact with opposite sides of the active layer 102, respectively.

The gate electrode 104 can include first and second interlayer insulating layers 105 and 106 between layers of the source electrode 108a and the drain electrode 108b. Any one of the first and second interlayer insulating layers can be omitted.

A storage capacitor can be configured by disposing a first storage electrode 104a on the same layer as the gate electrode and disposing a second storage electrode 109 on an upper portion of the first interlayer insulating layer 105 or an upper portion of the second interlayer insulating layer 106, which overlaps the first storage electrode 104a.

A protective layer 107 for protecting the thin film transistor TFT and first and second planarization layers 111 and 113 can be sequentially formed.

The drain electrode 108b of the thin film transistor TFT can be connected directly to the anode 120 of the light-emitting device through a contact hole formed by penetrating the protective layer and the first and second planarization layers 111 and 113, or as shown in the drawing, can be electrically connected to the anode 120 through a connection metal 112b on the first planarization layer 111 and a contact hole above and below the same.

The connection metal 112b and an electrode pattern 112a can have a different active layer from the aforementioned thin film transistor and can be used as a source electrode and a drain electrode of a thin film transistor on a different layer. In this instance, the active layer 102 close to the substrate 100 can be formed of poly silicon, and an active layer positioned at a relatively upper side can be an oxide semiconductor layer. Other types of semiconductors, such as amorphous silicon can be used for the active layer.

The first and second planarization layers 111 and 113 can be configured to planarize a step difference of lower layers and can be formed of an organic material such as photoacryl or BCB. But other materials, such as inorganic materials can be used for the first and second planarization layers 111 and 113.

The first and second interlayer insulating layers 105 and 106, the buffer layer 101, the gate insulating layer 103, and the protective layer 107 can be formed of an inorganic material used for, e.g., an oxide layer, a nitride layer, or an oxynitride layer.

In the transmissive unit T, the first and second planarization layers 111 and 113 and the bank 130 that are formed of an organic material can be removed or be absent from the transmissive unit T in order to improve transmittance.

The illustrated example can correspond to the state in which the second interlayer insulating layer 106 and the protective layer 107 that are formed of an inorganic material together with the first and second planarization layers 111 and 113 formed of an organic material are removed from the transmissive unit T. Depending on the instances, the second interlayer insulating layer 106 and the protective layer 107 can remain in the transmissive unit T. Alternatively, depending on the instances, a material having relatively low transmittance, which is used to form an insulating layer formed of an inorganic material, can also be selectively removed from the transmissive unit T.

The encapsulation layer 190 can be disposed on a capping layer 180 in order to seal and protect a lower structure.

For example, the encapsulation layer 190 can be configured by alternately disposing at least one inorganic encapsulation layer and an organic encapsulation layer, or the inorganic protective layer 185 can be formed on the capping layer 180, and a face seal can be applied to an inorganic protective layer and can be adhered to the substrate 100 to face an opposite substrate 200.

Depending on the instances, the substrate 100 on which the inorganic protective layer is formed and the opposite substrate can be adhered to each other by applying an edge seal to edges of the substrate 100 and the opposite substrate, instead of the face seal. A filter can be filled inside the edge seal between the substrate 100 and the opposite substrate 200.

The inorganic protection layer or the inorganic encapsulation layer in the encapsulation layer 190 can be formed of SiNx, SiON, or the like. Other materials can be used for the encapsulation layer 190 to seal an upper surface of the display device. A thickness of the encapsulation layer 190 can be different in the first region E and the second region T, but such is not required. Accordingly, the thickness of the encapsulation layer 190 can be the same in both regions E and T.

A color filter layer 210 can be further disposed on the encapsulation layer 190 to correspond to each light-emitting unit E, so that color filters 210$a$, 210$b$ and 210$c$ can respectively correspond to light emitting layers R-EML, G-EML and B-EML of the light emitting unit E. The color filter layer 210 can be in the first region E and not in the second region T in various embodiments, but such is not required.

The optical compensation layer 180 can have a refractive index equal to or less than that of the encapsulation layer 190.

The optical compensation layer 180 can include a plurality of layers, and the uppermost layer and the lowermost layer among the plurality of layers of the optical compensation layer 180 can have a refractive index less than that of the ETL 142.

The uppermost layer and the lowermost layer among the plurality of layers of the optical compensation layer 180 can have a refractive index equal to or less than the encapsulation layer 190.

The opposite substrate 200 can be positioned to correspond to a display surface, and thus can be referred to as a cover layer, a cover window, or a cover film. Depending on the instances, the cover layer can have an air gap corresponding to at least a portion of the encapsulation layer 190.

A display device according to other embodiments will be described below.

Figure 3B:
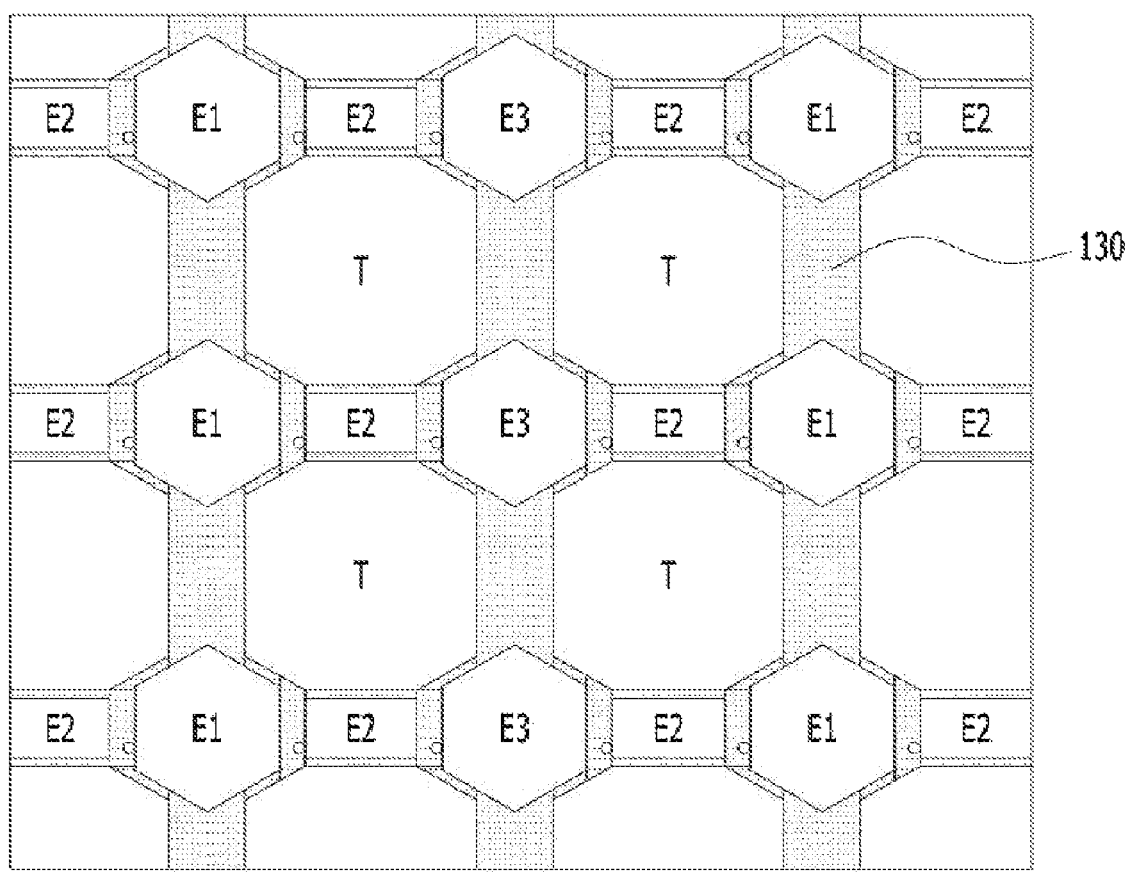

FIGS. 3A and 3B are plan views of a display device according to third and fourth embodiments of the present invention.

As shown in FIG. 3A, the light-emitting unit E can have, without being limited to, a square shape, or can have other polygonal shapes. In addition, corner portions of the light-emitting unit E can be rounded. The light-emitting unit E and the transmissive unit T can be formed with the same size and/or at the same ratio or can be formed with different sizes and/or at different ratios. For example, one transmissive unit can be disposed for each of red, green, and blue light-emitting units, or the transmissive unit T can be arranged for each of red, green, and blue light-emitting units at a ratio of 1:1, or 1:n (n being a natural number equal to or greater than 2).

As shown in FIG. 3B, in the display device according to the fourth embodiment, the transmissive unit T can be shaped like an octagon having eight sides by cutting each corner of an imaginary square. Two sides among four sides that are inclined with respect to the X axis can be adjacent to a first light-emitting unit E1 and the remaining two sides can be adjacent to a third light-emitting unit E3.

A second light-emitting unit E2 can be positioned between the first and third light-emitting units E1 and E3 to be adjacent to a side of the transmissive unit T, which is parallel to the X axis.

The first to third light-emitting units E1, E2, and E3 disposed around the transmissive unit T can emit light with different colors. The first and third light-emitting units E1 and E3 can have a larger area than that of the second light-emitting unit E2, and in this regard, when a weight is applied to a specific color in order to express color targeted by a display device, a light-emitting unit corresponding to the specific color can have a larger area. The first and third light-emitting units E1 and E3 can be shaped like an octagon, and the second light-emitting unit E2 can be shaped like a rectangle.

The bank 130 can be disposed between the first to third light-emitting units E1, E2, and E3 and between the first to third light-emitting units E1, E2, and E3 and the transmissive unit T.

According to the fourth embodiment of the present invention, the cathode 170 can be disposed not to overlap the area of the transmissive unit T.

In this instance, the cathode 170 can have the same transmittance with respect to an area corresponding to an aperture ratio of the transmissive unit T to the substrate 100.

Figure 4:
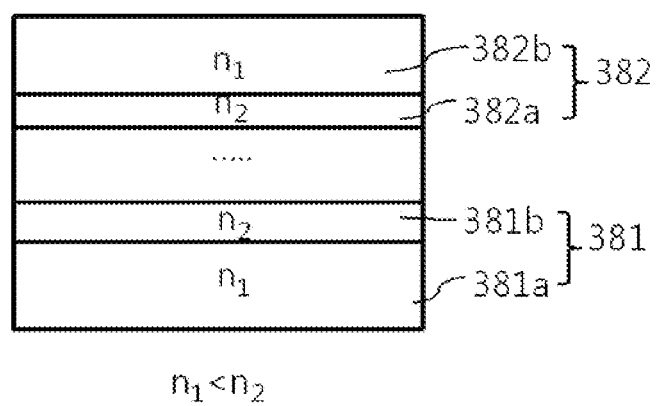
FIG. 4 is a cross-sectional view of an optical compensation layer according to another embodiment of the present invention.

FIG. 4 is a cross-sectional view of an optical compensation layer according to another embodiment of the present invention.

As shown in FIG. 4, another optical compensation layer can include a plurality of units 381 and 382 having low refractive index layers 381$a$, . . . , 382$b$ and high refractive index layers 381$b$, . . . , 382$a$, and in this instance, it may not be required to alternately position the low refractive index layer and the high refractive index layer, the lowermost portion of the optical compensation layer can correspond to the low refractive index layer 381$a$ and can be in contact with the cathode 170 of FIG. 1, and the uppermost portion can be in contact with the encapsulation layer 190. In this instance, the thickness of the low refractive index layer can be further increased, and in order to satisfy destructive interference characteristics, the thickness of the low refractive index layer can be approximately 1.8 to 2.2 times greater than the thickness of the high refractive index layer.

The aforementioned light-emitting display device according to embodiments of the present invention can be used to achieve high luminance and high transparency, and internal emission efficiency of the light-emitting device can be improved through destructive interference of the optical compensation layer 180.

The optical compensation layer 180 can have a multilayer structure, but refractive indexes of layers adjacent thereto can be lower than that of the organic layer.

Hereinafter, the significance of the display device according to embodiments of the present invention will be described with reference to Table 1 and FIGS. 5 to 9.

Figure 5:
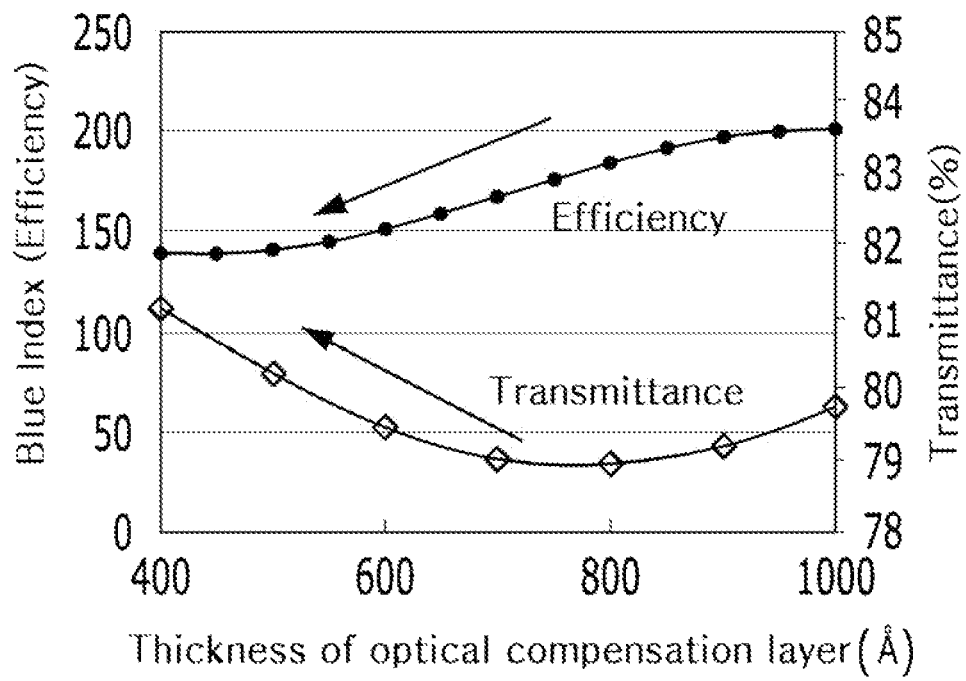
FIG. 5 is a graph showing efficiency and transmittance of an optical compensation layer depending on the thickness of an optical compensation layer according to a first experimental example.
Figure 6:
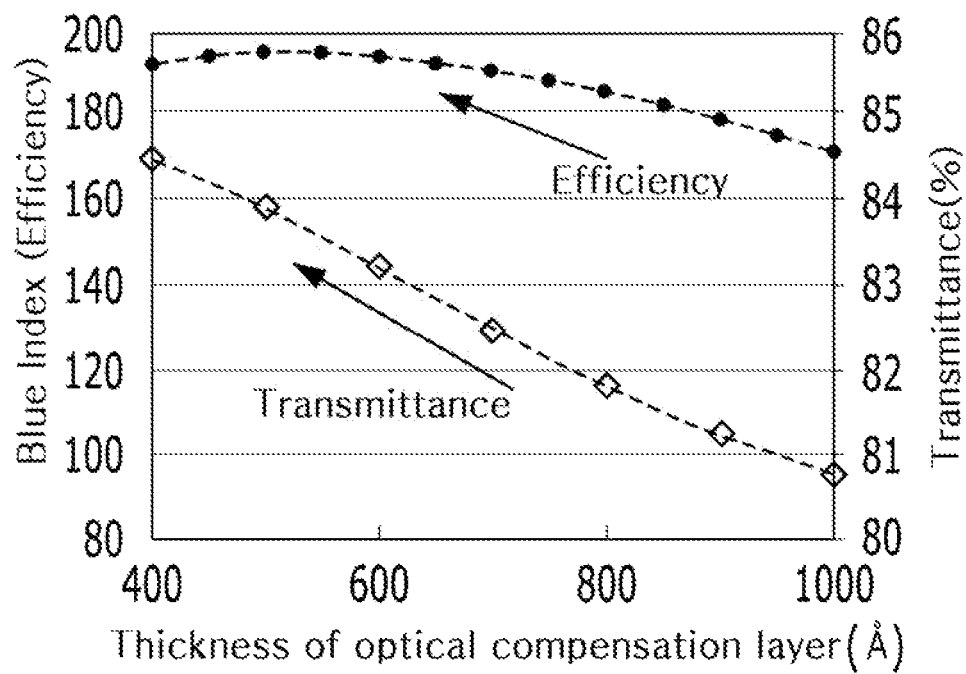
FIG. 6 is a graph showing efficiency and transmittance of an optical compensation layer depending on the thickness of an optical compensation layer according to a second experimental example.
Figure 7:
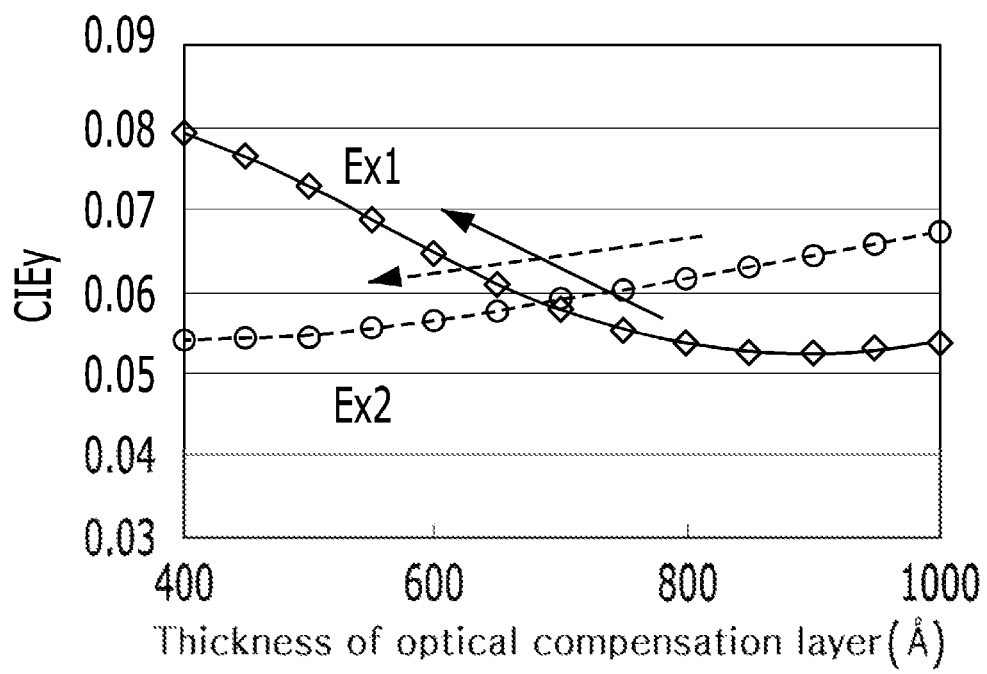
FIG. 7 is a graph showing a change in CIEy depending on the thickness of an optical compensation layer according to the first and second experimental examples.

FIG. 5 is a graph showing efficiency and transmittance of an optical compensation layer depending on the thickness of an optical compensation layer according to a first experimental example. FIG. 6 is a graph showing efficiency and transmittance of an optical compensation layer depending on the thickness of an optical compensation layer according to a second experimental example. FIG. 7 is a graph showing a change in CIEy depending on the thickness of an optical compensation layer according to the first and second experimental examples.

The capping layer in third to fifth experimental examples Ex3, Ex4, and Ex5 has a thickness of 300 Å, 500 Å, and 600 Å, respectively.

Figure 8A:
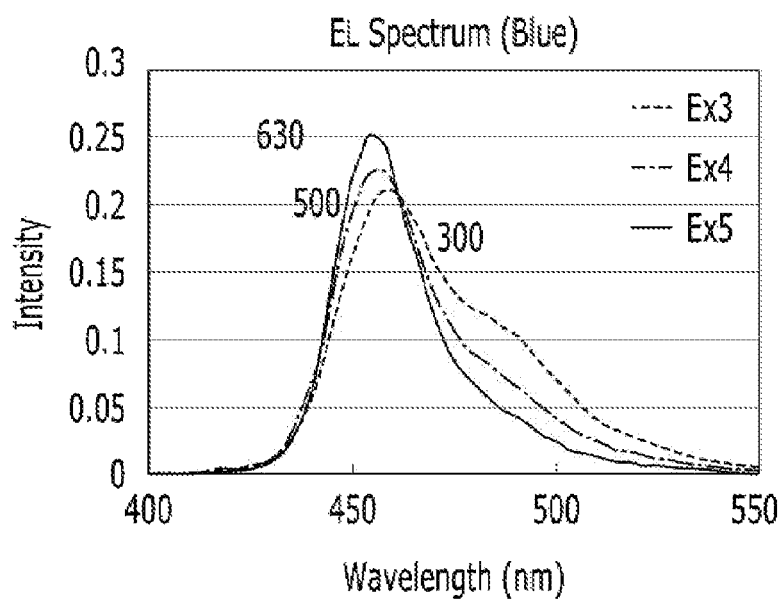
FIGS. 8A and 8B are graphs showing a change in transmittance depending on blue EL spectrum and the thickness of a capping layer according to third to fifth experimental examples.
Figure 8B:
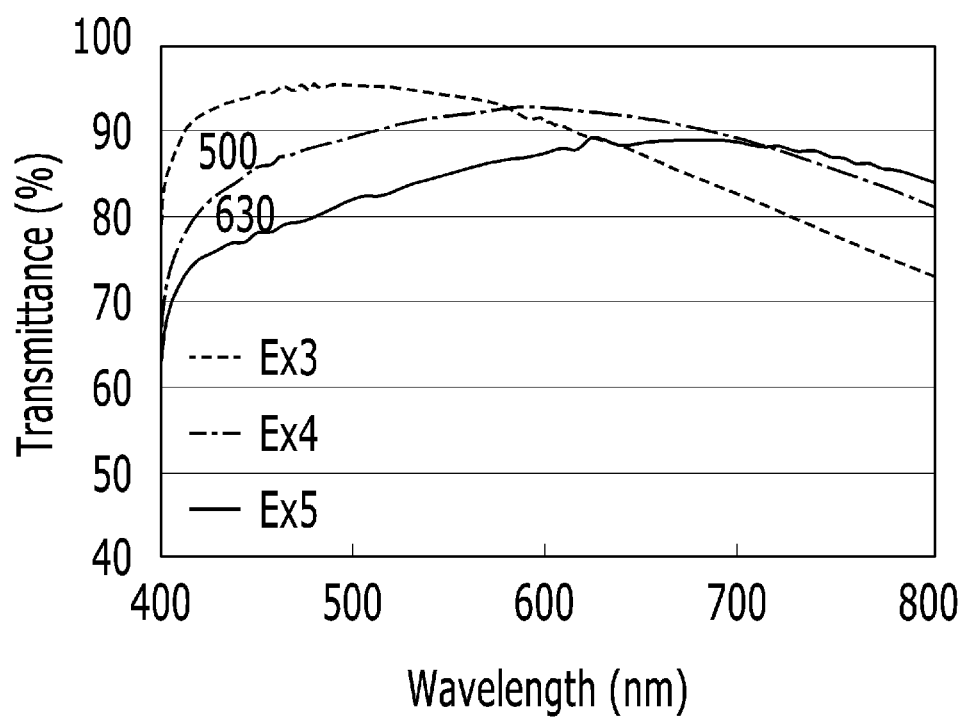

FIGS. 8A and 8B are graphs showing a change in transmittance depending on blue EL spectrum and the thickness of a capping layer according to third to fifth experimental examples.

As shown in FIG. 8B, when the thickness of the capping layer is reduced (Ex5→Ex4→Ex3), short wavelength transmittance can be improved but long wavelength transmittance can be poor, as shown in FIG. 8A, wavelength distribution can be broad and efficiency can become poor. In contrast, when the thickness of the capping layer is increased

TABLE 1

| Condition | | Structure of light-emitting unit | Color | Efficiency (%) | CIEx | CIEy | W efficiency (%) | OC transmittance (%) |
|---|---|---|---|---|---|---|---|---|
| Ex 1 | Optimal device efficiency | Constructive Interference | B | 100 | 0.136 | 0.054 | 100.0 | 79.8 |
| | | | G | 100 | 0.233 | 0.727 | | |
| | | | R | 100 | 0.680 | 0.313 | | |
| | Optimal transmittance | Destructive Interference | B | 50 | 0.137 | 0.054 | 64.3 | 82.1 |
| | | | G | 85 | 0.233 | 0.725 | | |
| | | | R | 107 | 0.680 | 0.315 | | |
| Ex 2 | Reduced thickness of OPL | Constructive Interference | B | 95 | 0.136 | 0.054 | 101.0 | 84.5 |
| | | | G | 105 | 0.234 | 0.729 | | |
| | | | R | 116 | 0.680 | 0.315 | | |

As seen from Table 1 above, experimenting on a structure for optimizing device efficiency in the first experimental example Ex1 is separately performed in the instance in which a constructive interference structure is applied to a structure of a capping layer and the instance in which a destructive interference structure is applied to the structure of the capping layer, and in this regard, the constructive interference structure has optimal device efficiency but has degraded transmittance characteristics, and the destructive interference structure has improved transmittance but has degraded white efficiency of the light-emitting unit.

In contrast, as shown in the structure of FIG. 1, when the second experimental example Ex2 is applied, constructive interference is applied to a device unit, but a phase of light is inverted by 180 degrees while reflection resonance of the light is repeated at an interface between an electron transport layer and an optical compensation layer having a low refractive index in a region of a transmissive unit in which a cathode is patterned and at an interface between the electron transport layer and the cathode in the light-emitting unit, and thus the light can be transmitted with similar characteristics to destructive interference.

For example, as seen from FIG. 5, in the first experimental example Ex1, when the thickness of the optical compensation layer is reduced, efficiency tends to be reduced and the size of the transmissive unit tends to be increased. For example, the transmissive unit and efficiency have opposite trends.

In contrast, as seen from FIG. 6, when the second experimental example Ex2 shown in FIG. 1 according to embodiments of the present invention is applied, if the thickness of the optical compensation layer is reduced, both the transmissive unit and the efficiency can be capable of being adjusted to be improved.

As seen from 7, for example, with respect to the same optical compensation layer and a thickness of 400 Å of a capping layer, a value of CIEy in the first experimental example Ex1 is increased and a value of CIEy in the second experimental example Ex2 is reduced, thereby improving a color reproduction range.

(Ex3→Ex4→Ex5), as shown in FIG. 8B, short wavelength transmittance can be reduced, and as shown in FIG. 8A, efficiency can be improved, and thus, it can be seen that it is difficult or impossible to achieve an effect of embodiments of the present invention by only increasing the thickness of the capping layer.

In the third to fifth experimental examples Ex3, Ex4, and Ex5, a cathode can be commonly applied to the light-emitting unit and the transmissive unit without patterning, and capping layers having the same thickness are applied.

Significance of the display device according to embodiments of the present invention can be seen from the aforementioned second experimental example Ex2.

In order to achieve extreme transparency of the display device, it can be required to pattern a cathode. However, when a resonance structure optimized for the patterned cathode is applied (constructive interference), transmittance can be largely reduced due to reflection and resonance based on a refractive index difference, and when a resonance structure optimized for transmittance is applied, efficiency can be degraded.

To overcome this, an optical structure of the display device according to embodiments of the present invention can be designed to change efficiency and transparency in the same trend and to increase the maximum transmittance depending on a change in optical distance irrespective of the light-emitting unit and the transmissive unit by proposing the optical design standard specialized for a transparent display device in which a phase of resonance is reversed between the light-emitting unit and the transmissive unit.

It can be seen that, when an optical compensation layer having a lower refractive index than that of an upper encapsulation layer and a lower encapsulation layer is designed, it is possible to achieve extreme transparency and the maximum efficiency of a transparent display (FIG. 6).

A refractive index of the optical compensation layer according to embodiments of the present invention can be lower than that of a lower organic layer (electron transport layer) and an inorganic protection layer to be positioned thereon.

As seen from FIG. 6, in a condition in which the optical compensation layers have the same thickness, both transmittance and efficiency are excellent in the second experimental example Ex2 corresponding to embodiments of the present invention compared with in the first experimental example Ex1, and in this instance, the optical compensation layer can have a thickness equal to or greater than 100 Å and equal to or less than 2000 Å.

The optical compensation layer can be an organic layer or an inorganic layer and can be formed of a material having a refractive index difference from upper and lower components. When the optical compensation layer includes a plurality of layers, the optical compensation layer can have a low refractive index at interfaces that are in contact with the uppermost and lowermost portions.

When the optical compensation layer has a thickness satisfying the above condition and has an optimized structure for RGB constructive interference, it can be possible to optimize transmittance by satisfying destructive interference in the transmissive unit due to a phase difference π at an interface between the organic layer and the optical compensation layer.

It can be seen that, the display device according to embodiments of the present invention is derived in that there is a need to develop a transparent display by patterning a cathode in order to achieve extreme transparency, and the optical compensation layer can be applied to improve both transmittance and efficiency.

A display device according to a present disclosure can comprise a substrate having a first region and a second region, an anode at the first region, an organic layer over the anode of the first region and the second region, a cathode on the organic layer of the first region, an optical compensation layer over the cathode of the first region and the organic layer of the second region, and including at least one layer having a lower refractive index than a refractive index of the organic layer and an encapsulation layer on the optical compensation layer.

The optical compensation layer can be in contact with the cathode at the first region and can be in contact with the organic layer at the second region.

The display device can further comprise an organic pattern on the organic layer. The second region can be a transmissive unit, the organic layer at the transmissive unit can include a hole transport layer and an electron transport layer and the organic pattern can be in contact with the optical compensation layer.

A phase of light can be changed by π at an interface between the organic layer and the optical compensation layer.

The organic layer can include an electron transport layer and the electron transport layer is in contact with the optical compensation layer at a transmissive unit.

The organic layer at the first region mat include a hole transport layer, a light-emitting layer, and an electron transport layer, and the hole transport layer and the electron transport layer can extend to the second region.

A light emitted from the light-emitting layer undergoes constructive interference between the anode and the cathode, and a light emitted from the transmissive unit undergoes destructive interference between the electron transport layer and the optical compensation layer.

The display device of can further comprise an inorganic protection layer between the optical compensation layer and the encapsulation layer. The inorganic protection layer can have a lower refractive index than a refractive index of the optical compensation layer.

A refractive index $n_{ETL}$ of the electron transport layer and a refractive index $n_{OCL}$ of the optical compensation layer satisfy:

$$\left(\frac{n_{ETL} - n_{OCL}}{n_{ETL} + n_{OCL}}\right)^2 > 1\%.$$

The optical compensation layer can have a thickness equal to or greater than 100 Å or equal to or less than 2000 Å.

The optical compensation layer can have a refractive index equal to or less than a refractive index of the encapsulation layer.

The optical compensation layer can include a plurality of layers, and an uppermost layer and a lowermost layer of the plurality of layers of the optical compensation layer can have a lower refractive index than the refractive index of the organic layer.

The uppermost layer and the lowermost layer of the plurality of layers of the optical compensation layer have a refractive index equal to or less than a refractive index of the encapsulation layer.

The display device according to embodiments of the present invention can have the following effects.

First, in a structure having a patterned cathode, an optical compensation layer can be applied to the cathode to invert a phase of resonance between the light-emitting unit and the transmissive unit. Accordingly, an optical structure can be designed to improve the maximum transmittance by improving both transmittance and efficiency based on a difference in the optical distance of light that is lastly emitted from the transmissive unit through the optical compensation layer and light emitted directly from the light-emitting unit.

Second, for RGB cavity, when a light-emitting unit is applied to be optimized for constructive interference, it can be possible to optimize transmittance by satisfying destructive interference in the transmissive unit due to a phase difference π between a final organic layer and the optical compensation layer in a light-emitting device.

It will be apparent to those skilled in the art that various modifications and variations can be made in embodiments of the present invention without departing from the spirit or scope of the inventions. Thus, it is intended that embodiments of the present invention cover the modifications and variations of this invention provided they come within the scope of the appended claims and their equivalents.

What is claimed is:

1. A display device comprising:
    a substrate having a first region and a second region, the second region having light transmittance;
    an anode at the first region;
    an organic layer at the second region and at the first region;
    a cathode on the organic layer of the first region, and the cathode being not on the organic layer of the second region;
    a bank between the first region and the second region;
    an optical compensation layer on the cathode of the first region and the organic layer of the second region; and
    an encapsulation layer on the optical compensation layer at the first region and the second region,
    wherein the cathode is interposed between the optical compensation layer and the organic layer over the first region, and wherein a distance between the optical compensation layer and the substrate in the second region is less than a distance between the anode and the substrate in the first region.

2. The display device of claim 1, wherein a lower surface of the optical compensation layer is in contact with the cathode at the first region.

3. The display device of claim 1, further comprising an organic pattern on the organic layer,
wherein:
the second region is a transmissive unit having the light transmittance;
the organic layer at the transmissive unit includes a hole transport layer and an electron transport layer; and
the organic pattern is in contact with the optical compensation layer.

4. The display device of claim 1, wherein a phase of light is changed by π at an interface between the organic layer and the optical compensation layer.

5. The display device of claim 1, wherein:
the organic layer includes an electron transport layer; and
the electron transport layer is in contact with the optical compensation layer at a transmissive unit at the second region, the transmissive unit having the light transmittance.

6. The display device of claim 1, wherein:
the organic layer at the first region includes a hole transport layer, a light-emitting layer, and an electron transport layer; and
the hole transport layer and the electron transport layer extend to the second region.

7. The display device of claim 6, wherein light emitted from the light-emitting layer undergoes constructive interference between the anode and the cathode, and light emitted from a transmissive unit of the second region undergoes destructive interference between the electron transport layer and the optical compensation layer.

8. The display device of claim 1, further comprising:
an inorganic protection layer between the optical compensation layer and the encapsulation layer,
wherein the inorganic protection layer has a lower refractive index than a refractive index of the optical compensation layer.

9. The display device of claim 1, further comprising an electron injection layer on the organic layer,
wherein the electron injection layer is in contact with the optical compensation layer at the second region.

10. The display device of claim 1, wherein the optical compensation layer has a thickness equal to or greater than approximately 100 Å or equal to or less than approximately 2000 Å.

11. The display device of claim 1, wherein the optical compensation layer has a refractive index equal to or less than a refractive index of the encapsulation layer.

12. The display device of claim 1, wherein:
the optical compensation layer includes a plurality of layers; and
an uppermost layer and a lowermost layer of the plurality of layers of the optical compensation layer have a lower refractive index than the refractive index of the organic layer.

13. The display device of claim 12, wherein the uppermost layer and the lowermost layer of the plurality of layers of the optical compensation layer have a refractive index equal to or less than a refractive index of the encapsulation layer.

14. The display device of claim 1, wherein:
the optical compensation layer includes a plurality of layers;
a lowermost layer of the optical compensation layer is a low refractive index layer and is in contact with the cathode;
an uppermost layer of the optical compensation layer is another low refractive index layer; and
an intermediate layer of the optical compensation layer is a higher refractive index layer and is interposed between the lowermost layer and the uppermost layer.

15. The display device of claim 1, wherein a thickness of the optical compensation layer over the second region is greater than a thickness of the optical compensation layer over the first region.

16. The display device of claim 1, wherein the organic layer is positioned closer to the substrate at the second region than at the first region.

17. The display device of claim 1, further comprising a planarization layer below the anode in the first region,
wherein the planarization layer is not formed in the second region.

18. A display device comprising:
a substrate having a first region and a second region, the second region having light transmittance;
an anode and a cathode at the first region, and the anode and cathode being not at the second region;
an organic layer on the first region and the second region;
a bank on the anode at the first region, not at the second region;
an optical compensation layer on the first region and the second region; and
an encapsulation layer commonly on the optical compensation layer over the first region and the second region,
wherein the optical compensation layer is on the organic layer over the second region, while the cathode is interposed between the optical compensation layer and the organic layer over the first region, and
wherein a distance between the optical compensation layer and the substrate in the second region is less than a distance between the anode and the substrate in the first region.

19. The display device of claim 18, wherein a thickness of the optical compensation layer on the second region is greater than a thickness of the optical compensation layer on the first region.

20. The display device of claim 18, wherein light undergoes constructive interference between the anode and the cathode, and undergoes destructive interference between the organic layer and the optical compensation layer.

21. The display device of claim 18, wherein the organic layer is positioned closer to the substrate at the second region than at the first region.

22. The display device of claim 18, further comprising an electron injection layer on the organic layer,
wherein the electron injection layer is in contact with the optical compensation layer at the second region.

23. The display device of claim 14, wherein a thickness of the uppermost layer and the lowermost layer is greater than a thickness of the intermediate layer having a higher refractive index than the uppermost layer and the lowermost layer.

* * * * *